United States Patent
Boorananut et al.

(10) Patent No.: US 6,437,595 B1
(45) Date of Patent: Aug. 20, 2002

(54) METHOD AND SYSTEM FOR PROVIDING AN AUTOMATED SWITCHING BOX FOR TESTING OF INTEGRATED CIRCUIT DEVICES

(75) Inventors: Sedta Boorananut; Wirach Fugdee; Adunkitt Mankhong, all of Nonthaburi (TH)

(73) Assignee: Advanced Micro Devices, Inc., Sunnyvale, CA (US)

(*) Notice: Subject to any disclaimer, the term of this patent is extended or adjusted under 35 U.S.C. 154(b) by 34 days.

(21) Appl. No.: 09/742,845

(22) Filed: Dec. 20, 2000

(51) Int. Cl.$^7$ ............................................. G01R 31/28
(52) U.S. Cl. ..................... 324/765; 324/158.1; 324/73.1
(58) Field of Search ............................. 324/158.1, 765, 324/73.1; 340/172.5; 371/20, 29

(56) References Cited

U.S. PATENT DOCUMENTS

| | | | | |
|---|---|---|---|---|
| 3,597,682 A | * | 8/1971 | Hubbs | 324/73.1 |
| 3,854,125 A | * | 12/1974 | Ehling et al. | 324/73.1 |
| 4,656,632 A | * | 4/1987 | Jackson | 324/73.1 |
| 4,736,374 A | * | 4/1988 | Kump et al. | 371/20 |
| 5,388,467 A | * | 2/1995 | Jereb et al. | 324/73.1 |

* cited by examiner

*Primary Examiner*—Michael J. Sherry
*Assistant Examiner*—Jimmy Nguyen
(74) *Attorney, Agent, or Firm*—Sawyer Law Group LLP

(57) ABSTRACT

A method and system for testing an integrated circuit using a plurality of parameters is disclose. The plurality of parameters are from a plurality of parameter sources. The integrated circuit includes a plurality of pins. The method and system include a signal converter, a controller coupled with the signal converter and a plurality of relays coupled with the controller. The signal converter is capable of being coupled with a computer system and is for converting between analog and digital signals. The signal converter receives values for the plurality of parameters from the computer and converts the values for the plurality of parameters to an analog signal indicating the values for the plurality of parameters. The controller is for receiving the analog signal from the signal converter and for providing at least one signal based on the analog signal. The plurality of relays is coupled with the integrated circuit and with the controller. The plurality of relays is for selectively coupling a portion of the plurality of pins of the integrated circuit with a portion of the plurality of parameter sources. The plurality of relays being controlled relays based on the at least one signal from the controller. The plurality of relays are thus controlled to provide the plurality of parameters from a portion of the plurality of parameter sources.

13 Claims, 5 Drawing Sheets

METHOD AND SYSTEM FOR PROVIDING AN AUTOMATED SWITCHING BOX FOR TESTING OF INTEGRATED CIRCUIT DEVICES

FIELD OF THE INVENTION

The present invention relates to integrated circuits, and more particularly to a method and system for allowing integrated circuits to be tested.

BACKGROUND OF THE INVENTION

FIG. 1 is a block diagram of a conventional testing system 10 for bench testing, or DC testing, an integrated circuit 1. The integrated circuit 1 includes pins 4 for electrically coupling the integrated circuit 1 to the conventional testing system 10. In order to test the integrated circuit 1, the integrated circuit 1 is coupled with a socket 20. The pins 4 of the integrated circuit 1 are plugged into the socket 20. The socket 20 is coupled with a switching box 30. The switch box 30 includes a control panel 32 having knobs and dials. The switching box 30 includes relays (not explicitly shown) for connecting different pins with different parameter sources 34, 36, 38, 40, 42 and 44. The parameter sources are preferably voltage sources.

FIG. 2 depicts a conventional method 50 for testing the integrated circuit 1 using the conventional testing system 10. In order to test the integrated circuit 1, an operator plugs the integrated circuit 1 into the socket 20, via step 52. An operator must then obtain the data book 12 for the conventional testing system 10, via step 54. The data book 12 indicates how to obtain a particular parameter from one of the parameter sources 34, 36, 38, 40, 42 and 44 for a particular pin of the integrated circuit 1. Thus, the data book 12 indicates how the operator must set the knobs and dials for the control panel 32 in order to obtain the desired voltages for each of the pins on the integrated circuit 1. The operator, therefore, reads and must understand the data book 12, via step 56. The operator then sets the knobs and dials on the control panel 32 in order to provide the desired parameters, typically voltages, to the socket 20 and, therefore, to the pins of the integrated circuit 1. The operator then reads the result of the test and records the response, via step 60. The operator then repeats steps 56–60 to complete testing of the integrated circuit, via step 62.

Although the conventional method 50 and conventional system 10 are capable of testing the integrated circuit 1, one of ordinary skill in the art will readily realize that the system 10 suffers from several drawbacks. The conventional system 10 and method 50 are difficult to use. In order to utilize the conventional system 10, an operator must be able to read and understand the data book 12. The operator must then be able to set the knobs and dials on the control panel 32 correctly. The operator must set the knobs and dials on the control panel 32 for a variety of parameters. For example, the operator must set the appropriate parameters for the DC bias, input leakage as well as open circuit and short circuit test parameters. This is difficult for an operator to do correctly and repeatably. The operator must also record the results of the testing. Although some conventional testing systems are capable of storing the resultants, the conventional system 10 typically has limited memory. Thus, the conventional system 10 typically has limited storage capacity. In addition, the conventional system typically utilizes a file format that is nontransferable. Thus, the resultant cannot be transferred to a computer system (not shown) for further analysis. In addition, the results cannot be easily incorporated into other documents and reports. Thus, both the setting of parameters and the recordation of results involve a great deal of manual work. This makes testing of the integrated circuit 1 prone to error. In addition, because so much is done manually, testing of the integrated circuit 1 using the conventional testing system 10 and the conventional method 50 is time consuming.

Accordingly, what is needed is a system and method for testing an integrated circuit 1 that is more efficient and less error prone. The present invention addresses such a need.

SUMMARY OF THE INVENTION

The present invention provides a method and system for testing an integrated circuit using a plurality of parameters. The plurality of parameters are from a plurality of parameter sources. The integrated circuit includes a plurality of pins. The method and system comprise providing a signal converter, a controller coupled with the signal converter and a plurality of relays coupled with the controller. The signal converter is capable of being coupled with a computer system and is for converting between analog and digital signals. The signal converter receives values for the plurality of parameters from the computer and converts the values for the plurality of parameters to an analog signal indicating the values for the plurality of parameters. The controller is for receiving the analog signal indicating the values for the plurality of parameters from the signal converter and for providing at least one signal based on the analog signal indicating the values for the plurality of values. The plurality of relays is coupled with the integrated circuit and with the controller. The plurality of relays is for selectively coupling a portion of the plurality of pins of the integrated circuit with a portion of the plurality of parameter sources. The plurality of relays being controlled relays based on the at least one signal from the controller. The plurality of relays are thus controlled to provide the plurality of parameters from a portion of the plurality of parameter sources.

According to the system and method disclosed herein, the present invention provides an operator with the ability to test integrated circuits based on information entered into and possibly stored by the computer system. Thus, the complexity of testing of the integrated circuit is significantly reduced.

DETAILED DESCRIPTION OF THE INVENTION

The present invention relates to an improvement in testing of integrated circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for testing an integrated circuit using a plurality of parameters. The plurality of parameters are from a plurality of parameter sources. The integrated circuit includes a plurality of pins. The method and system comprise providing a signal converter, a controller coupled with the signal converter and a plurality of relays coupled with the controller. The signal converter is capable of being coupled with a computer system and is for converting between analog and digital signals. The signal converter receives values for the plurality of parameters from the computer and converts the values for the plurality of parameters to an analog signal indicating the values for the plurality of parameters. The controller is for receiving the analog signal indicating the values for the plurality of parameters from the signal converter and for providing at least one signal based on the analog signal indicating the values for the plurality of values. The plurality of relays is coupled with the integrated circuit and with the controller. The plurality of relays is for selectively coupling a portion of the plurality of pins of the integrated circuit with a portion of the plurality of parameter sources. The plurality of relays being controlled relays based on the at least one signal from the controller. The plurality of relays are thus controlled to provide the plurality of parameters from a portion of the plurality of parameter sources.

The present invention will be described in terms of a certain apparatus having elements configured in a particular manner. However, one of ordinary skill in the art will readily recognize that this method and system will operate effectively for other systems having different elements configured in another manner which functions as the present invention.

Figure 1:
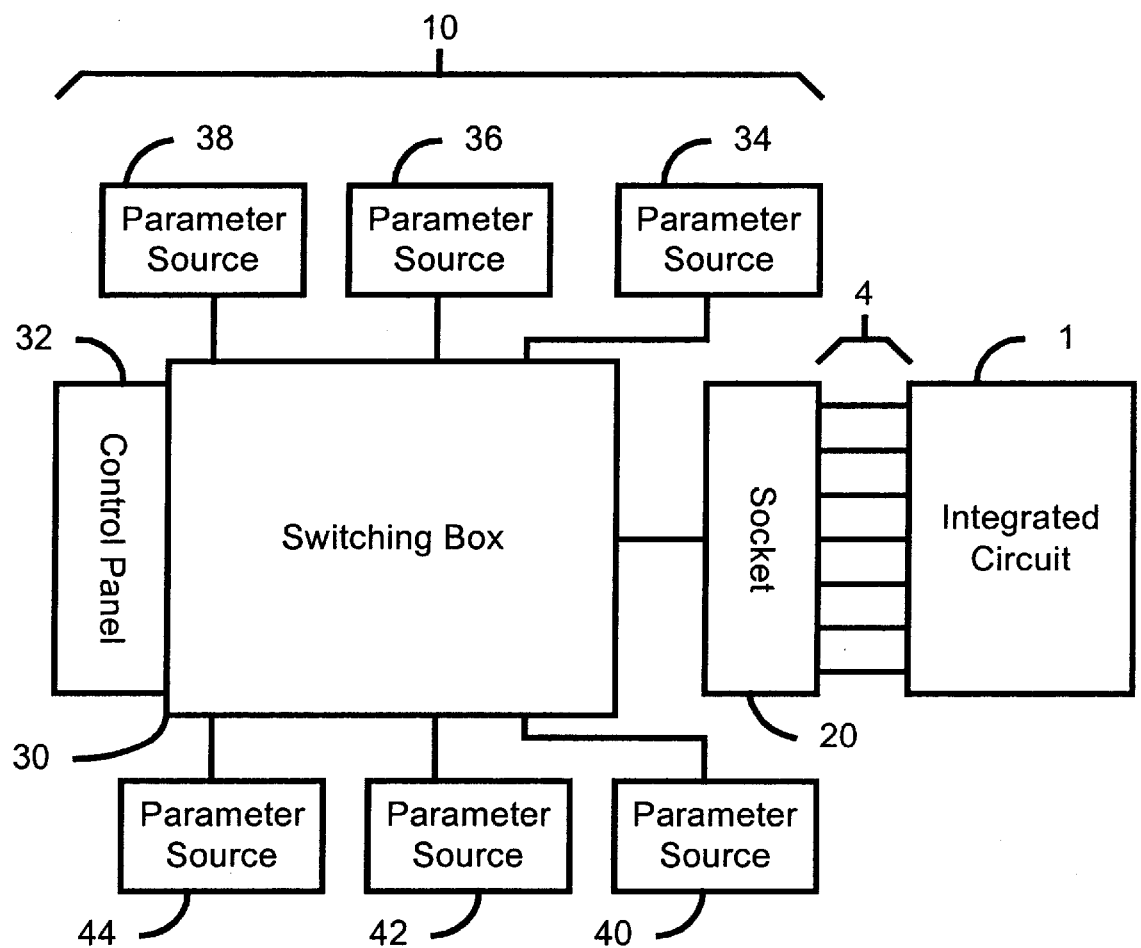
FIG. 1 is a block diagram of a conventional system for testing an integrated circuit.
Figure 2:
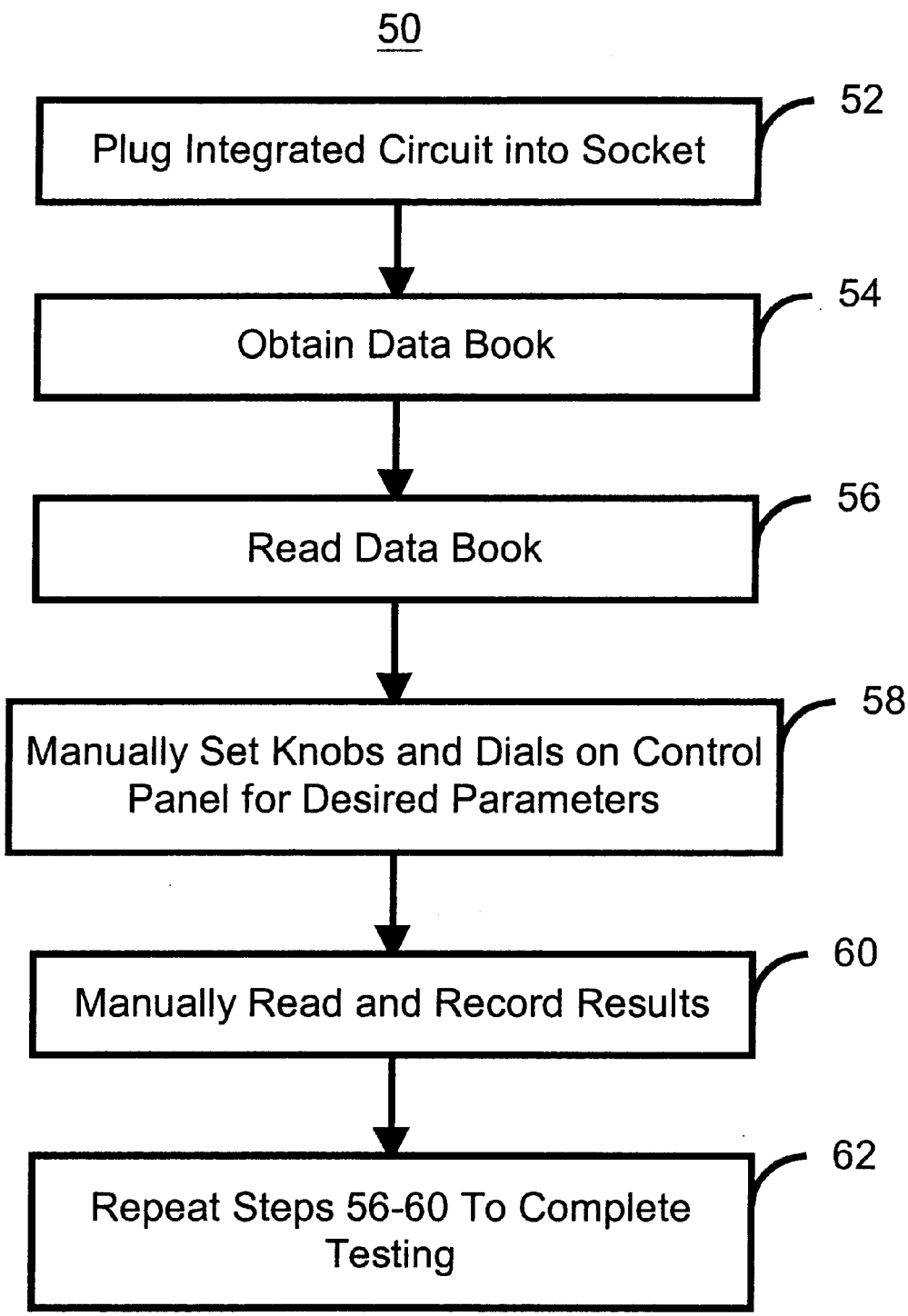
FIG. 2 is a flow chart depicting a conventional method for testing an integrated circuit.
Figure 3:
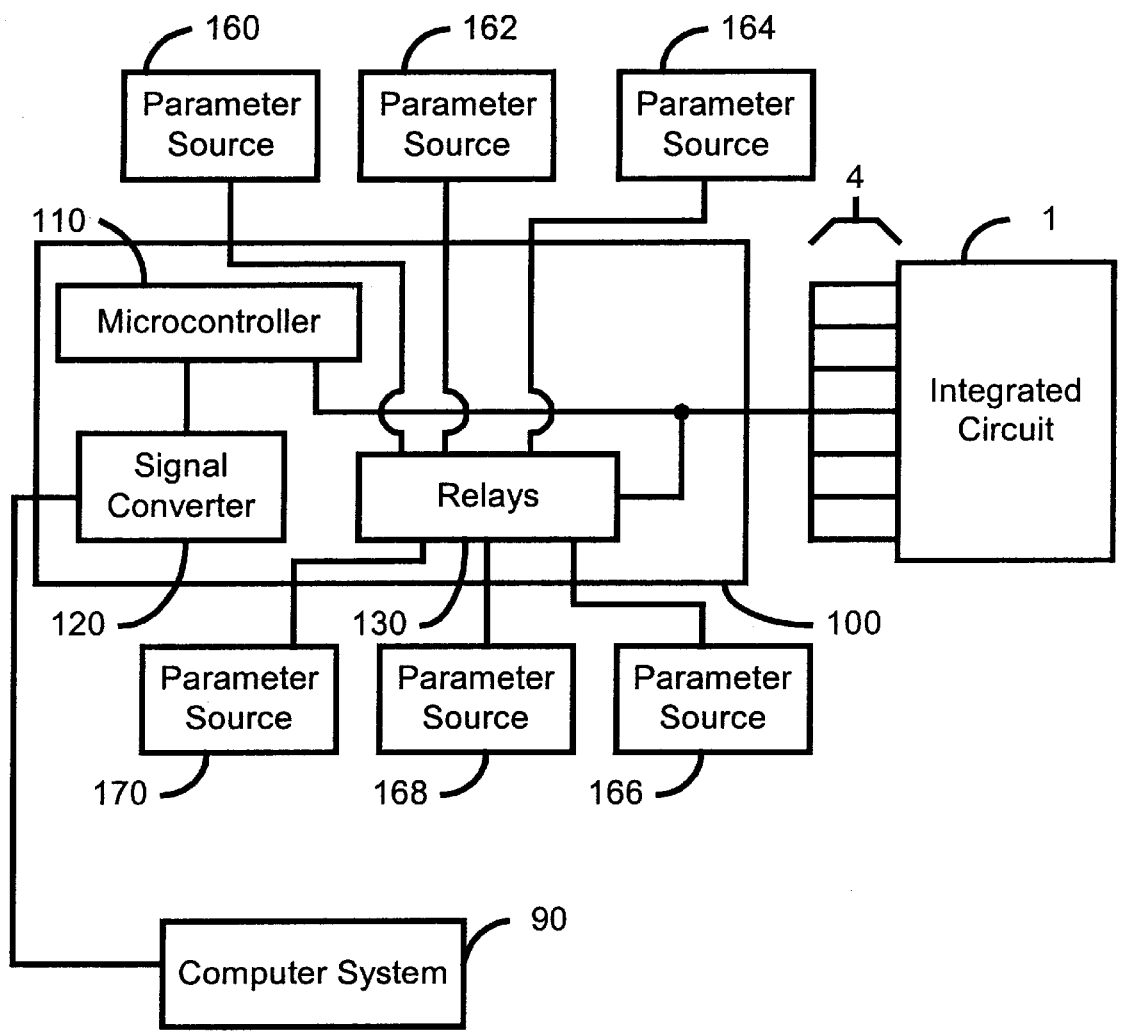
FIG. 3 is a high-level block diagram of one embodiment of a system in accordance with the present invention for automatically testing an integrated circuit.

To more particularly illustrate the method and system in accordance with the present invention, refer now to FIG. 3, depicting a high-level block diagram of one embodiment of a testing system 100 in accordance with the present invention used to automatically test an integrated circuit such as the integrated circuit 1. In addition to the testing system 100, the integrated circuit 1 and a computer system 90 are shown. The testing system 100 can be used in conjunction with the computer system 90. The testing system 100 includes a microcontroller 110, a signal converter 120 and a set of relays 130. The microcontroller 110 can be coupled with the computer system 90 as well as the integrated circuit 1. The microcontroller 110 is preferably coupled with the integrated circuit 1 through a socket (not explicitly shown in FIG. 3) into which the integrated circuit is plugged. The relays 130 are coupled with the parameter sources 160, 162, 164, 166, 168 and 170. The parameter sources 160, 162, 164, 166, 168 and 170 may be voltage or other sources used in setting the parameters to be provided to the pins 4 of the integrated circuit 1. The parameter sources 160, 162, 164, 166, 168 and 170 may or may not be incorporated into the testing system 100. The microcontroller 110 is coupled with the computer system 90 through the signal converter 120. The signal converter 120 converts between the digital signals of the computer 90 and the analog signals used by the microcontroller 110 and the remainder of the testing system 100. Thus, the microcontroller 110 can communicate with the computer system 90. Note, however, that where the microcontroller 110 can utilize digital signals input by the computer system 90, the signal converter 120 may be omitted or may perform other functions. Thus, the microcontroller 110 can receive instructions on the parameters to be set from the computer system 90. For example, the microcontroller 90 might be provided with certain values by the computer system 90. The microcontroller 110 converts the values provided by the computer system 90 to signals which can be used by the testing system 100 to control the relays 130. Thus, the microcontroller 110 automatically provides signals, preferably serial, to the relays 130 based on the values received. These signals are appropriate for the testing system 100 and allow the testing system 100 to provide the desired parameters to the integrated circuit 1. These signals are then used to control the relays 130 to ensure that the correct parameter sources 160, 162, 164, 166, 168 and 170 are coupled to the desired pins of the integrated circuit 1. Testing can of the integrated circuit 1 can then be performed.

Figure 4:
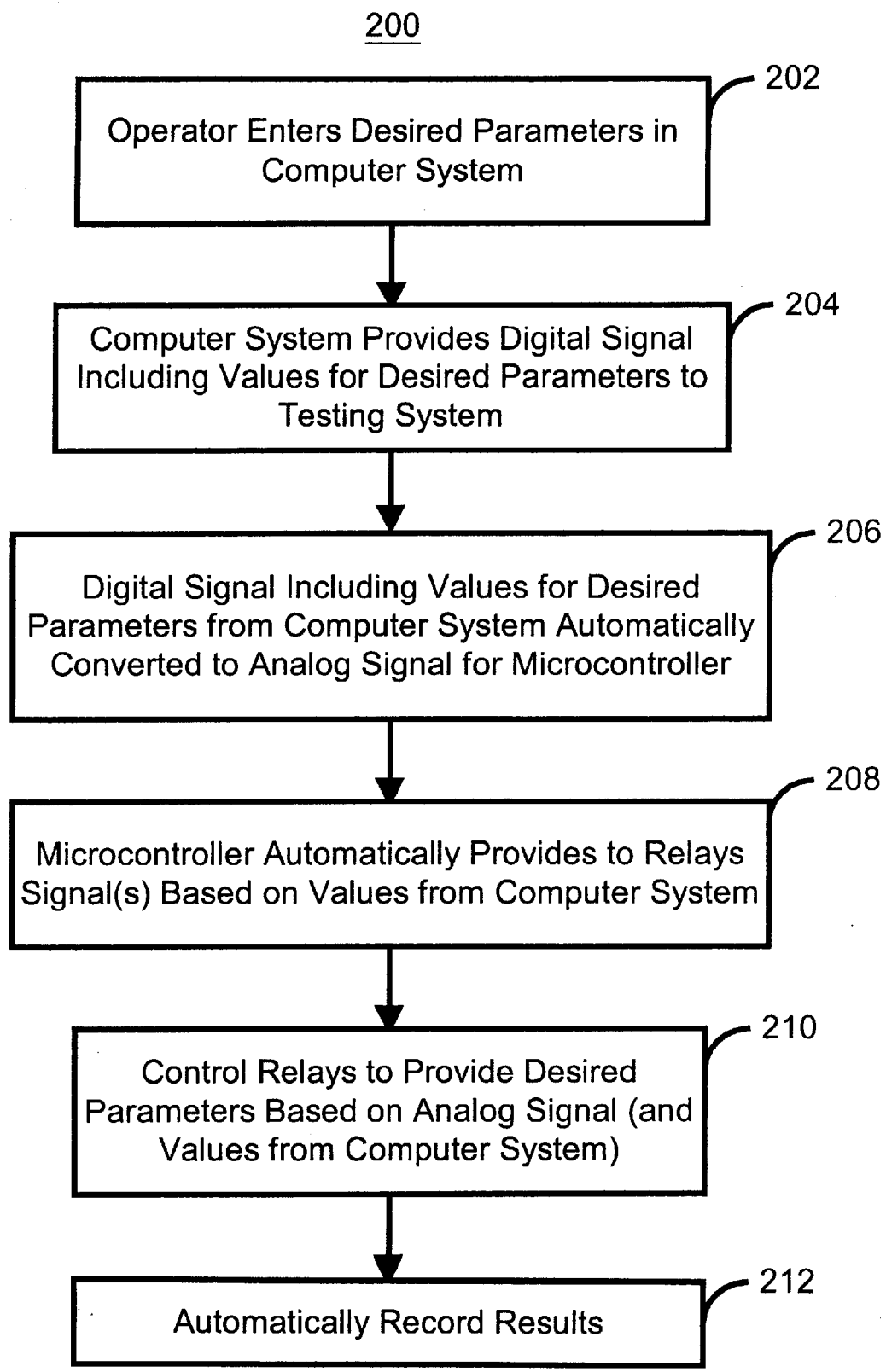
FIG. 4 is a high level flow chart of one embodiment of a method for testing an integrated circuit using the system in accordance with the present invention.

FIG. 4 is a high level flow chart of one embodiment of a method 200 testing an integrated circuit using the system in accordance with the present invention. The method 200 will be described in conjunction with the system 100 depicted in FIG. 3. Referring to FIGS. 3 and 4, the operator enters instructions on the parameters to be set using standard software, such as LAB VIEWS, on the computer system 90, via step 202. The computer system 90 provides the values in a digital signal to the testing system 100, via step 204. The signal converter 120 automatically converts the values from the computer system 90, which are provided in the digital signal, to analog signals for the microcontroller 110, via step 206. The microcontroller 110 receives the values, in analog form, related to the parameters based on the operator's instructions and compiles the signals, via step 206. The net result of steps 204 and 206 is that the computer system 90 provides a set of values to the microcontroller 110 based on how and what the parameters the operator desired set. The microcontroller 110 compiles these analog signals and provides new signals, based on the analog signal and, therefore, the values provided from the computer system 90. The new signals can be used by the system 100 to provide the desired parameters to the integrated circuit 1. Thus, the microcontroller 110 essentially takes the signals from the signal converter then provides signals that are based on the values provided by the computer to the relays, via step 208. Based on the signals, the relays 130 are then controlled to ensure that the correct parameter sources 160, 162, 164, 166, 168 and 170 are coupled to the desired pins of the integrated circuit 1, via step 21 0. The results of the integrated circuit for the parameters set are recorded, preferably automatically by the system 100, via step 212. The results might be recorded because the microcontroller 110 is coupled with the integrated circuit 1 and thus may receive data from the integrated circuit 1. The results are then preferably provided to the computer system 90, via step 214. Step 214 may also include converting the results from analog form to digital form.

Thus, the parameters for testing the IC can be set automatically. The operator need not know the specifics of the microcontroller 110, the signal converter 120 or the relays 130. Instead, the operator can easily enter the desired quantities for the parameters into the computer system 90. The parameters are then provided to the testing system 100 by the computer 90 and automatically set by the testing system 100 to the desired values. Thus, testing of the integrated circuit 1 is much simpler for an operator. Furthermore, because the operator can employ the computer system 90 to control the parameters through the testing system 100, the user may be able to save a desired set of parameters for future tests. Saving of the desired set of parameters simplifies the operator's task for future tests and helps to ensure that mistakes are not made in setting the parameters when future tests using the same parameters are performed. Thus, testing of the integrated circuit is made faster, more efficient, and less error-prone.

In addition, the system 100 and method 200 can simplify data analysis. Because the microcontroller 110 can communicate with both the computer system 90 and the integrated circuit 1, the results of the test can be automatically provided to the computer system 90. These results can be saved in a standard format and analyzed using other software. Furthermore, the results can be added to documentation or used in another manner. This is accomplished without subjecting the results to recordation errors that might be introduced by an operator. Testing of the integrated circuit 1 can, therefore, be made even more efficient and cost effective as well as less subject to error.

Figures 5A, 5B:
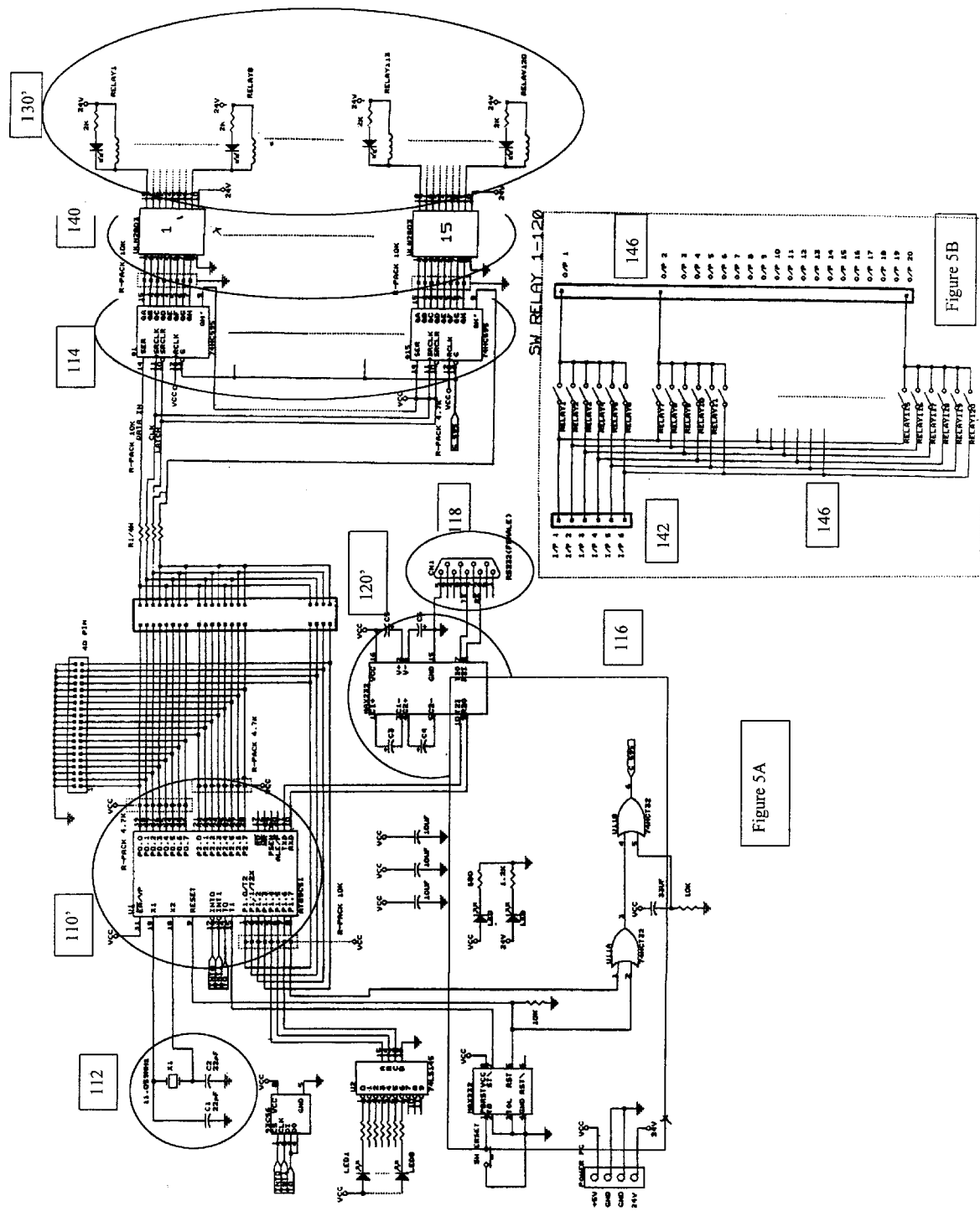
FIG. 5A is a more detailed diagram of a preferred embodiment of a system in accordance with the present invention for automatically testing an integrated circuit.
FIG. 5B is a more detailed diagram of a preferred embodiment of a relay controller in accordance with the present invention.

FIG. 5A is a more detailed diagram of a preferred embodiment of a testing system 100' in accordance with the present invention for automatically testing an integrated circuit. For clarity, only a portion of the testing system 100' is described in detail. Portions of the system 100' are analogous to the system 100 and are, therefore, labeled similarly. Thus, the testing system 100' includes a microcontroller 110', a signal converter 120' and relays 130'. The testing system 100' also includes a clock signal generator 112, parallel/serial converters 114, a reset mechanism 116, an interface 118 and a relay controllers 140. The clock signal generator 112 is used to provide a clock signal that is use by the microcontroller 110'. The reset mechanism 116 is used to reset the microcontroller 110' and the relay controllers 140. The interface 118 is used to couple with the computer system (not shown). In a preferred embodiment, the interface 118 is an RS-232 interface. The signal converter 120' converts a digital signal from the computer system (not shown) to an analog signal that can be used by the microcontroller 110'. Preferably, the signal converter 120' converts a five-volt TTL signal to an RS-232 signal and vice-versa. The parallel/serial converters 114 convert a serial signal from the microcontroller 110' to parallel signals to be provided to the relay controllers (one through fifteen) 140. Preferably the relay controllers 140 include fifteen controllers, each for eight relays. The relay controllers 140 are coupled to the relays 130. Preferably, there are one hundred and twenty relays 130 coupled with each of the relay controllers 140.

FIG. 5B depicts a preferred embodiment of one of the relay controllers 140'. The relay controller 140' includes six inputs 142 and twenty outputs 144 that are selected from one hundred and twenty relays 146. Based on the signals provided to the inputs 142, the relay controller 140' controls the outputs 144.

Referring to FIGS. 5A and 5B, in operation, a digital signal relating to the parameters to be provided to the integrated circuit (not shown) is provided to the testing system 100' via the interface 118. The digital signal includes values indicating the desired parameters. The signal converter 120' converts the digital signal to an analog signal. The analog signal also indicates the values for the parameters. The analog signal is provided to the microcontroller 110'. The microcontroller 110' converts the analog signal into a serial signal which is usable by the system 100' to provide the desired parameters to the integrated circuit. This serial signal is provided to the parallel/serial converter 114. The parallel/serial converter 114 converts the serial signal to parallel signals that are provided to the relay controllers 140. Each of the relay controllers 140 receives the parallel signals via inputs 142 and provides an output over one or more of the outputs 144. The outputs of the relay controllers 140 control the appropriate ones of the relays 130' to be coupled to the appropriate voltages. These voltages are thus provided to the socket 150 and, therefore, to the integrated circuit. Thus, the system 100' can provide the desired parameters to the integrated circuit.

In addition, the microcontroller 110' can receive data from the integrated circuit through the socket 150. This data can be provided back to the computer system through the microcontroller and the signal converter 120'.

Thus, the system 100' has many of the same advantages as the system 100. The system 100' automatically provides the desired parameters to the integrated circuit based on inputs from the computer system. Thus, an operator can easily enter the desired parameters into the computer system, preferably using standard software. As a result, the operator need not manually control the relays 130 and the parameters. Thus, the operator is less likely to make an error in inputting the parameters. In addition, an operator may save the parameters in the computer system for reuse. Consequently, the operator can repeat tests without concern over additional errors introduced by the operator. Moreover, the system 100' can automatically provide the results of the test to the computer. The results can then be saved, preferably in a standard, usable format. Thus, recordation of the results of the test is less subject to human error. In addition, the amount of data stored is only limited by the memory of the computer system used. Because the memory is typically large, the results can generally be easily stored. An operator can also easily access the results for analysis and documentation. Thus, the testing system 100' is simpler to use, more efficient and less subject to error.

A method and system has been disclosed for automatically testing an integrated circuit using a computer system. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for testing an integrated circuit using a plurality of parameters, the plurality of parameters from a plurality of parameter sources, the integrated circuit including a plurality of pins, the system comprising:

a signal converter capable of being coupled with a computer system for converting between analog and digital signals, the signal converter receiving values for the plurality of parameters from the computer and for converting the values for the plurality of parameters to an analog signal indicating the values for the plurality of parameters;

a controller coupled with the signal converter, the controller for receiving the analog signal indicating the values for the plurality of parameters from the signal converter and for providing at least one signal based on the analog signal indicating the values for the plurality of values;

a plurality of relays coupled with the integrated circuit and with the controller, the plurality of relays for selectively coupling a portion of the plurality of pins of the integrated circuit with a portion of the plurality of parameter sources, the plurality of relays being controlled relays based on the at least one signal, the plurality of relays thereby being controlled to provide the plurality of parameters from a portion of the plurality of parameter sources.

2. The system of claim 1 wherein the at least one signal is a first serial signal and wherein the system further includes:

a serial/parallel converter coupled between the microcontroller and the plurality of relays, the serial/parallel converter for converting the first serial signal from the microcontroller to a first plurality of parallel signals and for converting a second plurality of parallel signals from the plurality of relays to a second serial signal.

3. The system of claim 2 further comprising:

a plurality of relay controllers coupled with the plurality of relays and the serial/parallel converter, the plurality of relay controllers for controlling the plurality of relays based on the values for the plurality of parameters from the computer system.

4. The system of claim 1 further comprising: means for resetting the controller.

5. The system of claim 1 wherein the computer includes an interface and wherein the system further includes:

a second interface for coupling with the interface for the computer system and the system.

6. The system of claim 1 wherein the controller further receives a plurality of inputs from the integrated circuit, each of the plurality of inputs indicating a result of a test of the integrated circuit, and wherein the controller further provides data relating to the plurality of inputs to the computer system.

7. The system of claim 6 wherein each of the plurality of relay controllers further includes:

a plurality of inputs and a plurality of outputs, the plurality of outputs used to operate a portion of the plurality of relays.

8. A method for testing an integrated circuit using a plurality of parameters, the plurality of parameters from a plurality of parameter sources, the integrated circuit including a plurality of pins, the method comprising the steps of:

(a) allowing a user to enter a plurality of values for the plurality of parameters into a computer system for testing the integrated circuit;

(b) receiving the plurality of values for the plurality of parameters in a signal converter coupled with the computer system;

(c) converting at least one digital signal from the computer system to provide at least one analog signal for a controller;

(d) utilizing the controller to provide at least one signal for controlling a plurality of relays to provide the plurality of parameters; and (e) controlling a plurality of relays based on the values for the plurality of parameters from the computer system using the at least one signal, the plurality of relays being coupled with the integrated circuit and with the at least one signal converter, the plurality of relays for selectively coupling a portion of the plurality of pins of the integrated circuit with a portion of the plurality of parameter sources.

9. The method of claim 8 wherein the at least one signal is a first serial signal and wherein the method further includes the step of:

(f) utilizing a serial/parallel converter coupled between the microcontroller and the plurality of relays to converting the first serial signal from the microcontroller to a first plurality of parallel signals and for converting a second plurality of parallel signals from the plurality of relays to a second serial signal.

10. The method of claim 9 further comprising the step of:

(g) utilizing a plurality of relay controllers coupled with the plurality of relays and the serial/parallel converter for controlling the plurality of relays based on the values for the plurality of parameters from the computer system.

11. The method of claim 8 wherein the computer includes an interface and wherein the method further includes the step of:

(f) utilizing a second interface signal converter for converting between the interface for the computer system and the system.

12. The method of claim 8 wherein the controller further receives a plurality of inputs from the integrated circuit, each of the plurality of inputs indicating a result of a test of the integrated circuit, and wherein the controller further provides data relating to the plurality of inputs to the computer system.

13. The method of claim 12 wherein each of the plurality of relay controllers further includes a plurality of inputs and a plurality of outputs, the plurality of outputs used to operate a portion of the plurality of relays.

* * * * *